(12) United States Patent
Wang

(10) Patent No.: US 8,007,228 B2
(45) Date of Patent: Aug. 30, 2011

(54) WIND GUIDING COVER

(75) Inventor: Chen-Ho Wang, Taipei (TW)

(73) Assignee: Inventec Corporation, Taipei (TW)

( * ) Notice: Subject to any disclaimer, the term of this patent is extended or adjusted under 35 U.S.C. 154(b) by 569 days.

(21) Appl. No.: 12/243,135

(22) Filed: Oct. 1, 2008

(65) Prior Publication Data
US 2010/0003126 A1    Jan. 7, 2010

(30) Foreign Application Priority Data
Jul. 4, 2008   (TW) ............................... 97125301 A

(51) Int. Cl.
*F04D 29/54* (2006.01)
(52) U.S. Cl. ......... 415/146; 415/211.2; 415/26; 415/48; 415/49; 454/208; 454/184
(58) Field of Classification Search .................. 415/126, 415/146, 48, 49, 26, 211.2; 454/208, 184
See application file for complete search history.

(56) References Cited

U.S. PATENT DOCUMENTS

| | | | | |
|---|---|---|---|---|
| 4,543,941 | A * | 10/1985 | Newell | 126/293 |
| 7,302,967 | B2 * | 12/2007 | Maeda et al. | 137/512.1 |
| 7,800,902 | B2 * | 9/2010 | Della Fiora et al. | 361/695 |
| 7,952,870 | B1 * | 5/2011 | Zhou | 361/695 |

* cited by examiner

*Primary Examiner* — Benjamin Sandvik
*Assistant Examiner* — Krista Soderholm
(74) *Attorney, Agent, or Firm* — Muncy, Geissler, Olds & Lowe, PLLC

(57) ABSTRACT

A wind guiding cover, mounted on a fan, includes a rotating ring and a plurality of slats. The rotating ring is pivoted to the fan, and has an opening for an air flow generated by the fan to pass through. The rotating ring has a weight portion for offsetting the center of gravity of the rotating ring and normally maintaining the rotating ring at a static equilibrium position. The slats are pivoted to the rotating ring and arranged at the opening. When the fan operates, the slats are lifted by the air flow to open the opening. When the fan stops operating, the slats cover the opening under the gravity.

7 Claims, 10 Drawing Sheets

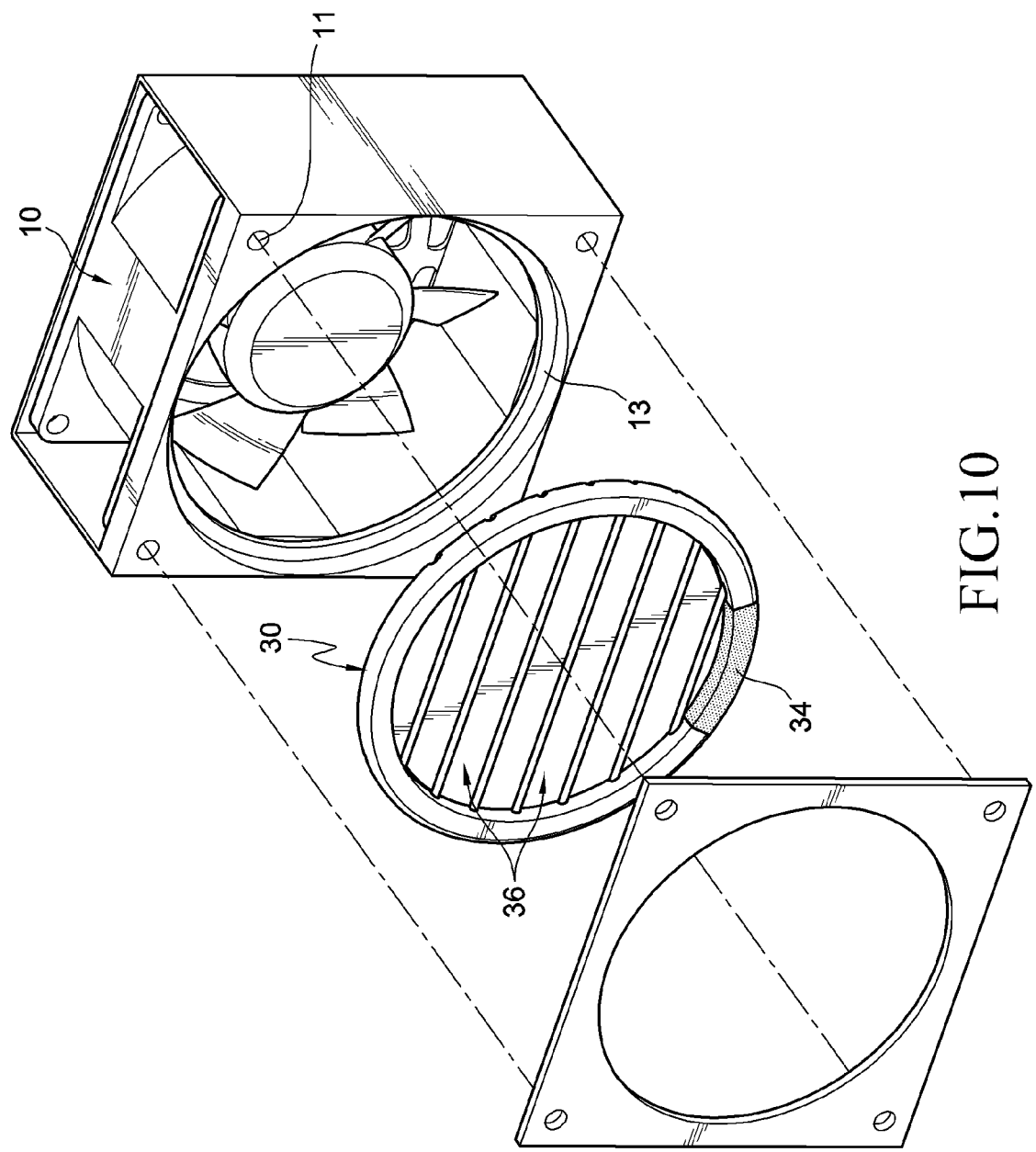

WIND GUIDING COVER

CROSS-REFERENCE TO RELATED APPLICATIONS

This non-provisional application claims priority under 35 U.S.C. §119(a) on Patent Application No(s). 097125301 filed in Taiwan, R.O.C. on Jul. 4, 2008 the entire contents of which are hereby incorporated by reference.

BACKGROUND OF THE INVENTION

1. Field of Invention

The present invention relates to a fan of an electronic apparatus, and more particularly, to a wind guiding cover capable of self-closing when the fan is not in operation.

2. Related Art

Along with an increasing processing speed of computer equipments, thermal-dissipation issues due to the long-time operation of electronic parts therein will occur, and directly affect the performance and stability of the computer equipments. Therefore, how to quickly dissipate the waste thermal generated by the electronic parts so as to improve the thermal-dissipation efficiency has become the toughest problem in the industry during recent years. In the commonly adopted thermal-dissipation methods, an electronic part in need of improving the thermal-dissipation effect is inevitably added with a thermal-dissipation module constituted by heatsink fin sets, heat pipes, fans, and the like, and then the system fan of the computer host exhausts the waste thermal out of the case, so as to lower the temperature in the computer host.

As for industrial computers and servers, a large number of electronic parts are disposed within the hosts and are densely arranged, so the requirements on thermal dissipation are higher than those ordinary computer equipments. In addition, since the arrangement of the electronic parts is quite compact, the flow resistance against the air flows within the hosts is large. Therefore, the number of fans disposed in the hosts of the industrial computers or servers is greater than that of the ordinary computer equipments. Moreover, in the prior art, in order to increase the flux of the thermal-dissipation air flows to overcome the flow resistance, a plurality of fans is disposed side by side. For example, the fans are first fixed to a frame side by side, and then fixed to the host case with the frame.

However, when the fans are arranged side by side, as long as one of the fans stops operating due to damage or failure, the air flow may flow back from the gap of the failed fan under pressure difference. That is, the air will flow from the air-outlet side back to the air-inlet side via the failed fan, so that the flow field becomes unstable, thus affecting the flow rate and flux of the air flow. When the flow rate and flux of the air flow passing through the electronic parts are reduced, the thermal-dissipation efficiency of the electronic parts will certainly be alleviated. As a result, the waste thermal generated by the operation of the electronic parts cannot be successfully dissipated, and will be accumulated within the computer host case. Therefore, with the power-on operation of the computer, the temperature in the case continuously rises due to poor convection, thus weakening the performance and stability of the computer equipment, or even resulting in damages to the computer equipment under a high temperature.

In order to solve the problem that the air flow field of the densely arranged fans in the server is interfered, a design has been proposed in this industry to add louver slats to the fan or fan board. Such louver slats can be closed when the fan fails to operate so as to prevent the flow field being interfered. However, the conventional louver slats have to be manually opened or closed, and are inconvenient in use. In addition, some louver slats may be lifted by the air flow when the fan operates and closed under the gravity when the fan stops. Moreover, the fans are fixed on a mobile rack of the server, and the mobile rack may be placed on the server transversely or in an upright manner. Therefore, when the mobile rack is transversely placed, the louver slats can certainly be successfully closed when the fan stops. However, when the mobile rack is placed in an upright manner, the louver slats cannot be successfully closed, and the thermal-dissipation efficiency will be affected.

SUMMARY OF THE INVENTION

In the prior art, the fans within the industrial computers or servers are disposed side by side. As long as one of the fans fails, the air flow will flow back to alleviate the thermal-dissipation efficiency. Accordingly, the present invention is directed to a wind guiding cover applicable to a fan disposed side by side with others, so as to automatically cover the air inlet and outlet of the fan when failed, thus avoiding the backflow of the air flow.

The wind guiding cover of the present invention is mounted on a fan. In fact, the fan is a heatsink fan used in an industrial computer or a server host, for operating to generate an air flow. The wind guiding cover includes a rotating ring and a plurality of slats. The rotating ring is rotatably disposed on the fan and has an opening for the air flow to pass through. The rotating ring is provided with a weight portion for offsetting the center of gravity of the rotating ring and normally maintaining the rotating ring at a static equilibrium position. The weight portion enables the rotating ring to swing and is maintained at the bottom of the rotating ring due to the gravity. The slats are pivoted to an outer edge of the rotating ring and arranged at the opening. When the fan operates, the slats are driven by the air flow generated by the fan and swing toward the flow direction of the air flow, so as to open the opening of the rotating ring for the air flow to pass through. When the fan stops operating, the slats spontaneously drop under the gravity, so as to cover the opening of the rotating ring to avoid the backflow of the air flow.

The present invention may achieve the following efficacy. As the rotating ring is normally maintained at a static equilibrium position due to the weight portion, the slats are normally kept at horizontal positions. In that case, when the fan stops operating, the slats spontaneously drop and swing downward under the gravity to cover the opening of the rotating ring, so as to prevent the air flow from flowing back when the fan fails or stops operating, thus effectively avoiding the weakening of the thermal-dissipation efficiency.

BRIEF DESCRIPTION OF THE DRAWINGS

The present invention will become more fully understood from the detailed description given herein below for illustration only, and thus are not limitative of the present invention, and wherein:

FIG. 10 is an exploded view of a wind guiding cover and a fan according to a third embodiment of the present invention.

DETAILED DESCRIPTION OF THE INVENTION

Figure 1:
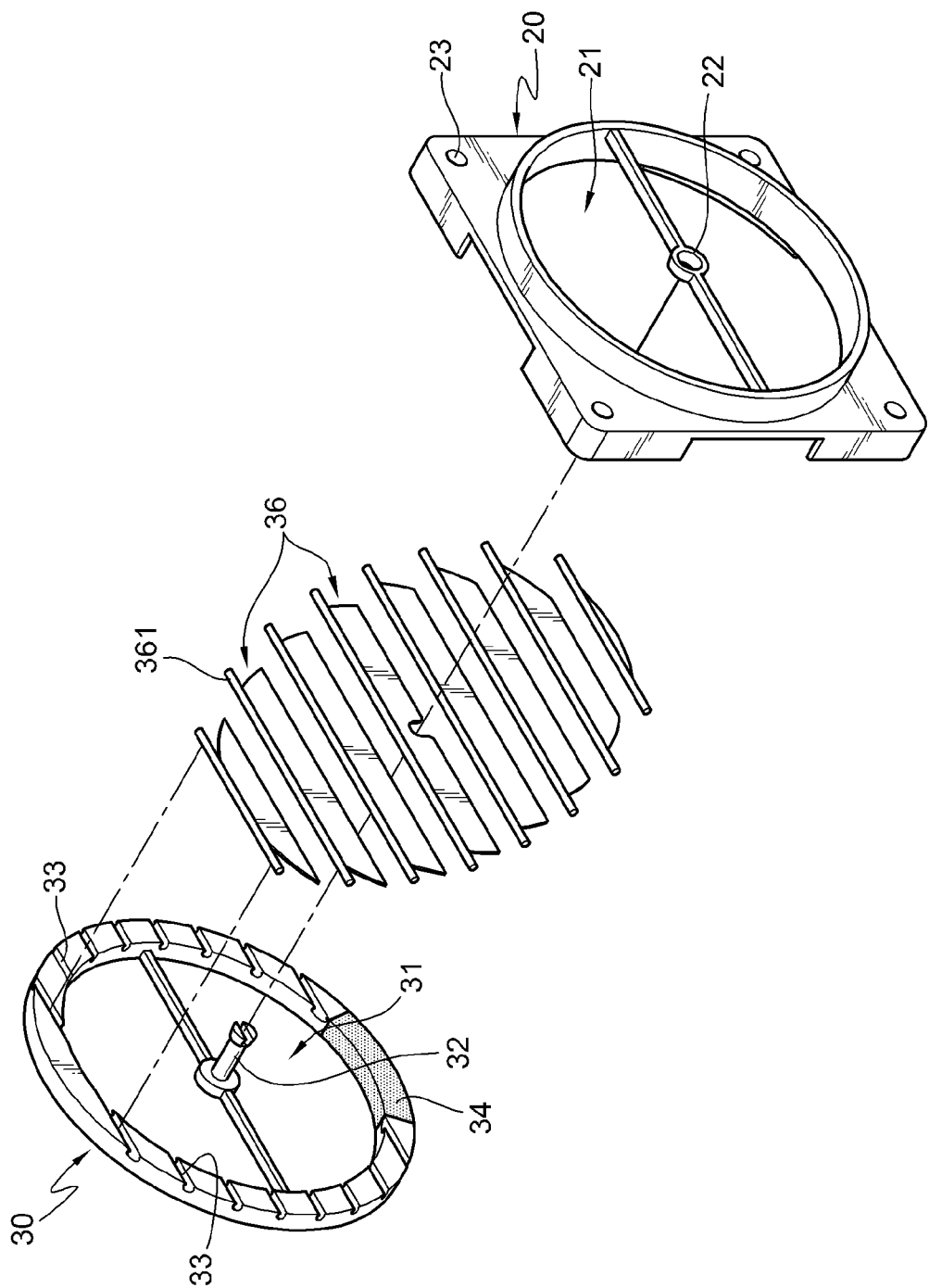
FIG. 1 is an exploded view of a wind guiding cover according to a first embodiment of the present invention.

The objectives, structures, features, and functions of the present invention will be illustrated in detail below in the accompanying embodiments. The wind guiding cover of the present invention is most preferably applied to heatsink fans within industrial computers or server hosts. However, the present invention may also be applied to heatsink fans of personal computers or other electronic apparatus, and is not limited to the embodiments of the present invention.

FIGS. 1 to 4 are schematic views of a wind guiding cover according to a first embodiment of the present invention. The wind guiding cover of the first embodiment is mounted on a fan 10. The fan 10 operates to generate an air flow after being powered on, and is provided with a plurality of bolt holes 11. The wind guiding cover of this embodiment includes a fixed cover 20, a rotating ring 30, a plurality of slats 36, and a plurality of bolts 24.

Figure 2:
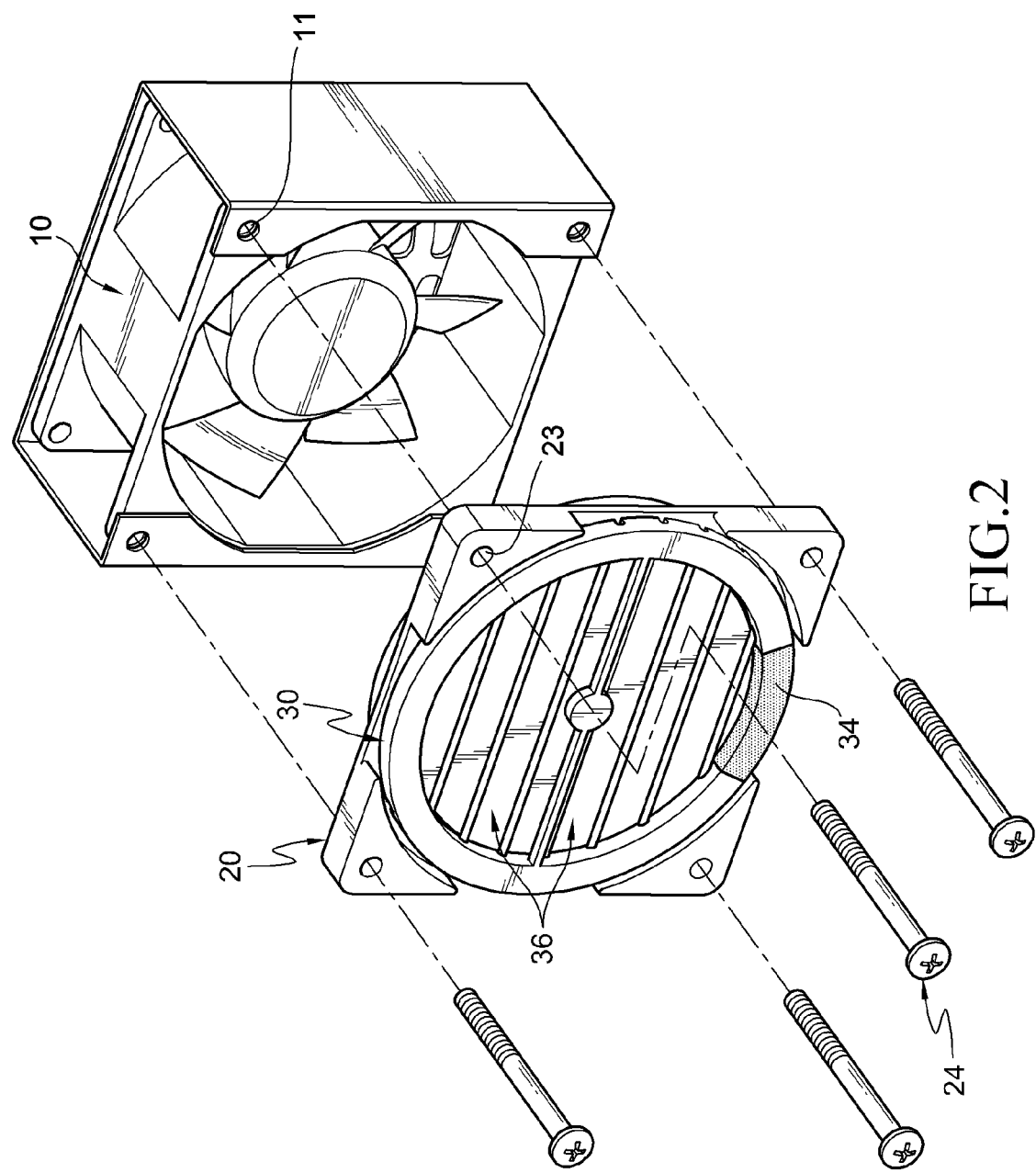
FIG. 2 is an exploded view of the wind guiding cover and a fan according to the first embodiment of the present invention.
Figure 3:
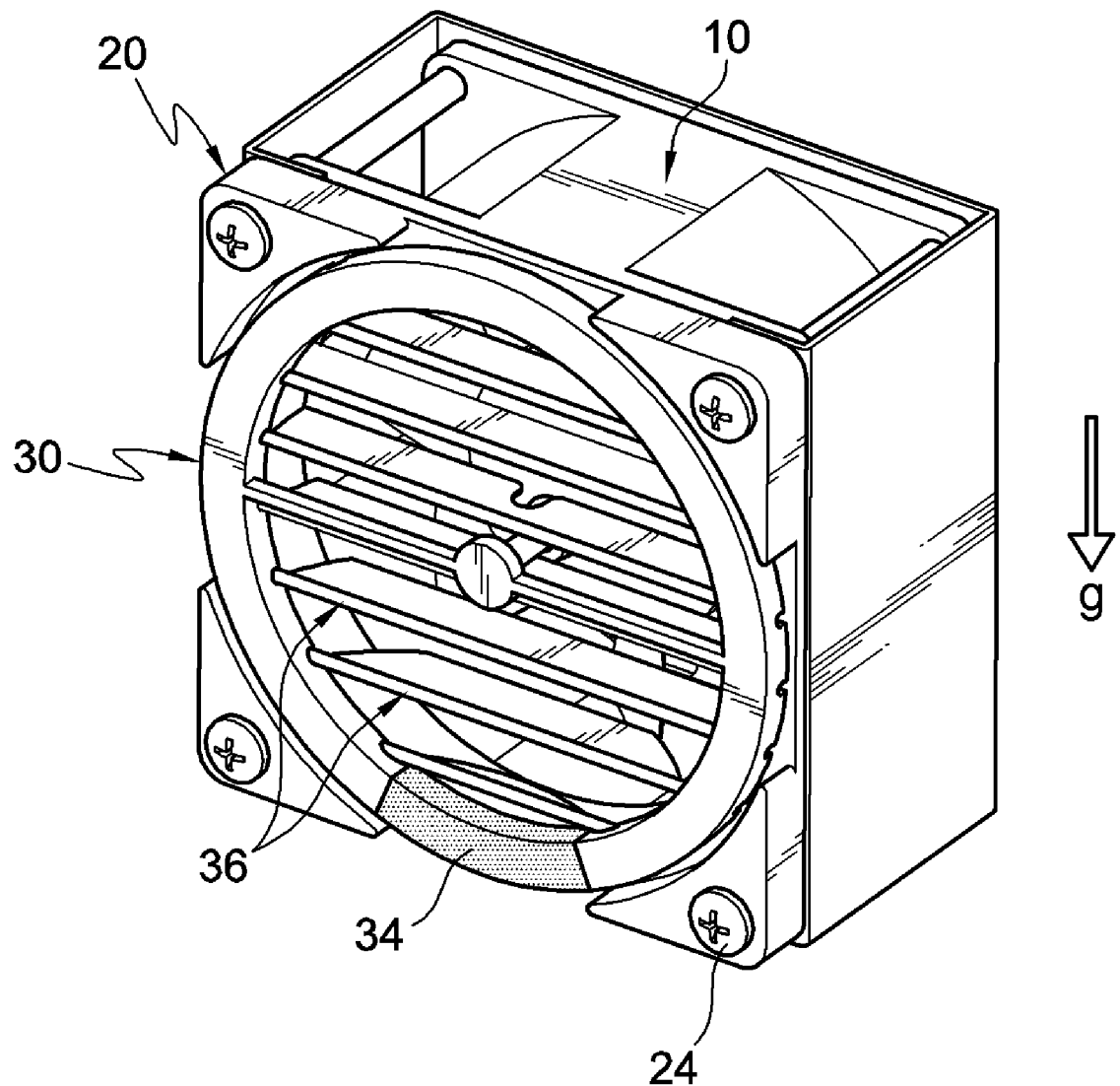
FIG. 3 is a perspective view of the wind guiding cover assembled to the fan according to the first embodiment of the present invention, in which the slats are lifted when the fan operates.

Referring to FIGS. 2 and 3, the fixed cover 20 is fixed to one side of the fan 10 by bolts. This side may be an air-outlet side or an air-inlet side, and this embodiment takes the air-inlet side as an example for illustration. The fixed cover 20 is provided with an opening 21, a bearing 22, and a plurality of through-holes 23. The bearing 22 is approximately disposed at the center of the opening 21, and is retained there by ribs connected to the edge of the opening 21. The through-holes 23 are respectively corresponding to the bolt holes 11 of the fan 10. The bolts 24 are screwed into the corresponding bolt holes via the through-holes 23, so as to lock the fixed cover 20 to the fan 10.

Referring to FIGS. 1 to 4, the rotating ring 30 has an opening 31, a camshaft 32, a plurality of pairs of pivot holes 33, and a weight portion 34. The camshaft 32 is approximately disposed at the center of the opening 31, and is connected to the edge of the opening 31 via ribs for fixing. The camshaft 32 is inserted into the bearing 22 of the fixed cover 20, so as to make the rotating ring 30 pivoted to the fixed cover 20 and thus rotatably assembled to the fan 10 via the fixed cover 20. In addition, the opening 31 of the rotating ring 30, corresponding to the opening 21 of the fixed cover 20, allows the air flow of the fan 10 to pass through. The camshaft 32 overlaps the rotating shaft of the fan 10, so that the rotating ring 30 may rotate about the rotating shaft of the fan blades on the fixed cover 20 via the camshaft 32. The pivot holes 33 are disposed at an outer edge of the rotating ring 30 and corresponding to two ends of the camshaft 32 in pairs along the weight portion 34.

The weight portion 34 is a relatively heavy portion on the rotating ring 30, and capable of making the center of gravity of the whole rotating ring 30 offset from the camshaft 32 at the center toward the outer edge. In practice, the weight portion 34 can be made of a material of high specific gravity such as metal, and the other portions of the rotating ring 30 can be made of a material of low specific gravity such as plastic, so as to fulfill the offset of the center of gravity toward the weight portion 34. Through the configuration of the weight portion 34, the rotating ring 30 is normally maintained at a static equilibrium position on the fixed cover 20. That is, when the fan 10 is placed in the vertical gravity direction of the rotating shaft of the blades, the rotating ring 30 rotates toward the above static equilibrium position due to the gravity. When the rotating ring 30 stops rotating and is under no external force, the weight portion 34 is positioned at the bottom of the rotating ring 30.

Referring to FIGS. 1 to 4, the slats 36 are respectively pivoted to the rotating ring 30 and arranged at the opening 31 of the rotating ring 30. Each slat 36 has a shaft 361, and the shaft 361 is disposed at a long side of the slat 36. The pivot holes 33 on the rotating ring 30 are opened in a direction approximately parallel to the weight portion 34, such that the long sides of the slats 36 when mounted on the rotating ring 30 are facing the weight portion 34. Two ends of each shaft 361 are respectively inserted into each pair of the pivot holes 33 on the rotating ring 30, and thus the slats 36 are able to swing about the shafts 361 relative to the rotating ring 30. The slats 36 are of different shapes for being pieced together to form a shape that can completely cover the opening 31. The weight portion 34 is maintained at the bottom of the rotating ring 30 under the gravity, and thus the long sides of the slats 36 are kept horizontal.

Figure 4:
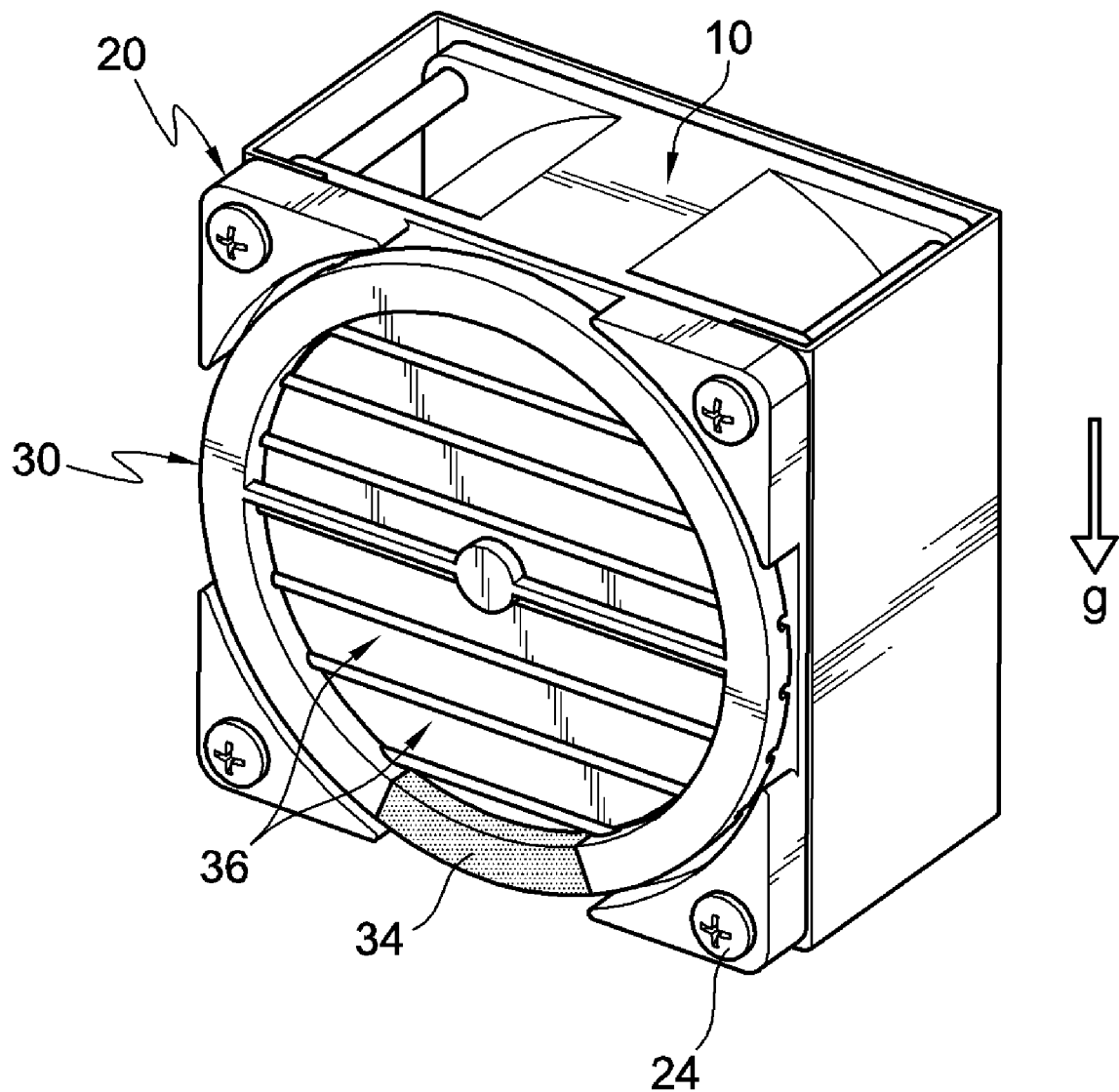
FIG. 4 is a perspective view of the wind guiding cover assembled to the fan according to the first embodiment of the present invention, in which the slats are closed when the fan stops operating.

As shown in FIGS. 3 and 4, the fan 10 is placed in the vertical gravity direction (represented by an arrow plus "g" in the figures) of the rotating shaft of the blades, and the slats 36 are normally kept horizontal through the configuration of the weight portion 34. When the fan 10 operates, the slats 36 are driven by the air flow generated by the fan 10 to swing in the flow direction of the air flow to be lifted (as shown in FIG. 3), so as to open the opening 31 of the rotating ring 30 for the air flow to pass through. When the fan 10 stops operating, no air flow is blown out. At this point, the slats 36 spontaneously drop due to the gravity (as shown in FIG. 4), so as to cover the opening 31 of the rotating ring 30 to avoid the backflow of the air flow.

Figure 5:
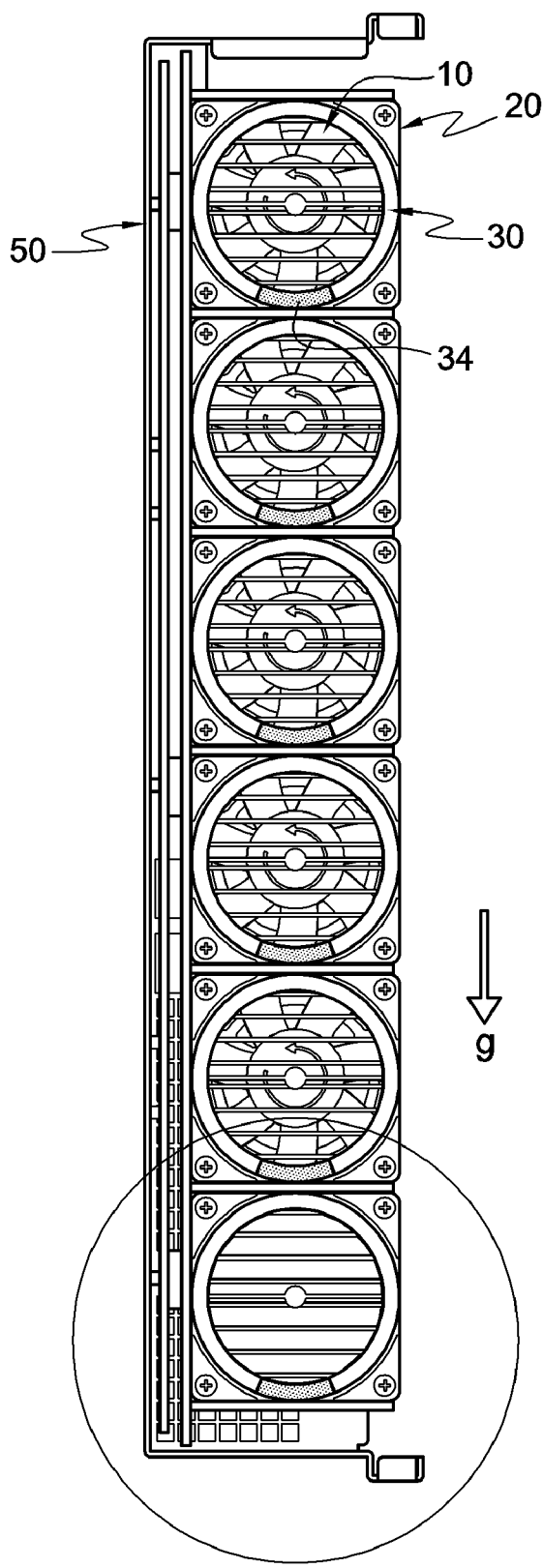
FIG. 5 is a plan view of the wind guiding covers and the fans assembled to a mobile rack according to the first embodiment of the present invention, in which the mobile rack is mounted on a server in an upright manner.
Figure 6:
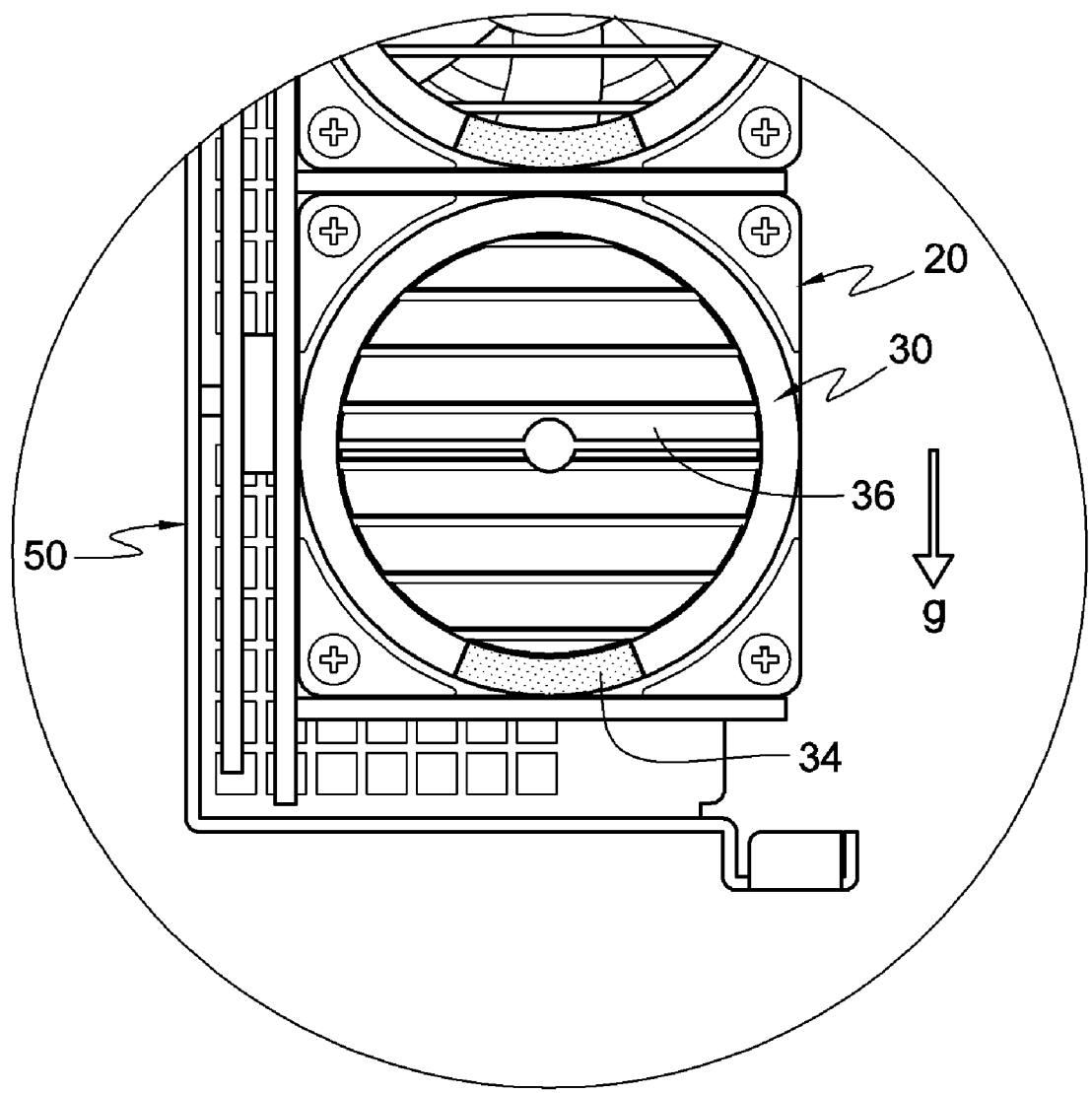
FIG. 6 is a schematic partial enlarged view of FIG. 5.
Figure 7:
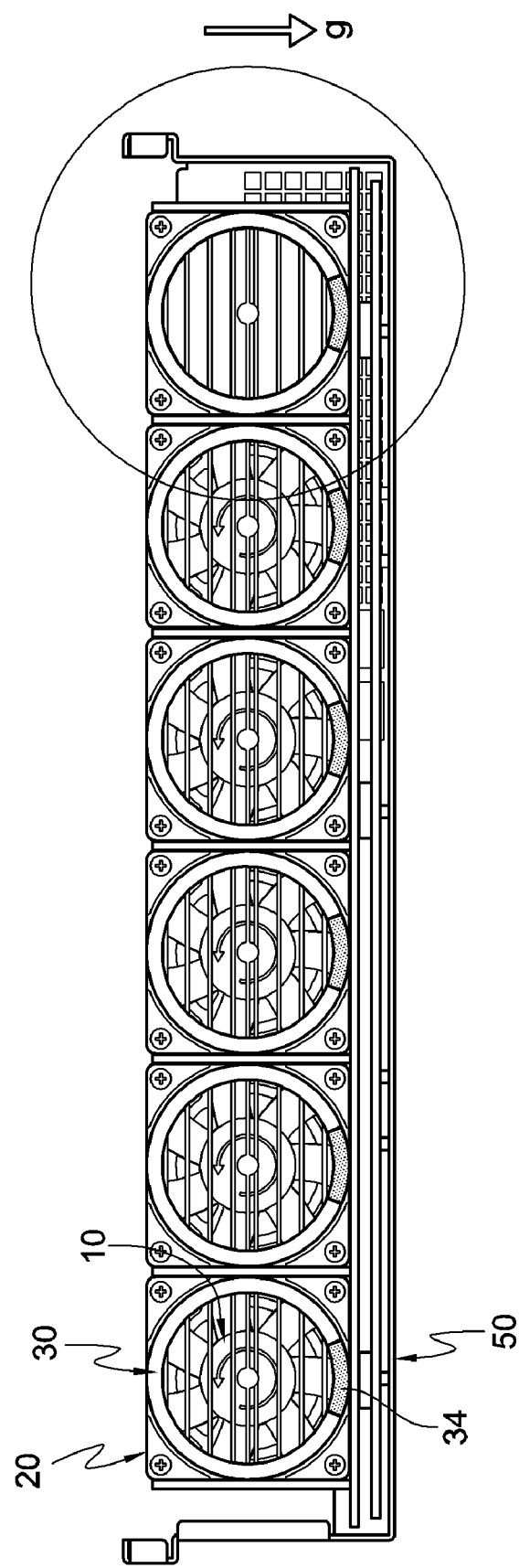
FIG. 7 is a plan view of the wind guiding covers and the fans assembled to a mobile rack according to the first embodiment of the present invention, in which the mobile rack is transversely laid on a server.
Figure 8:
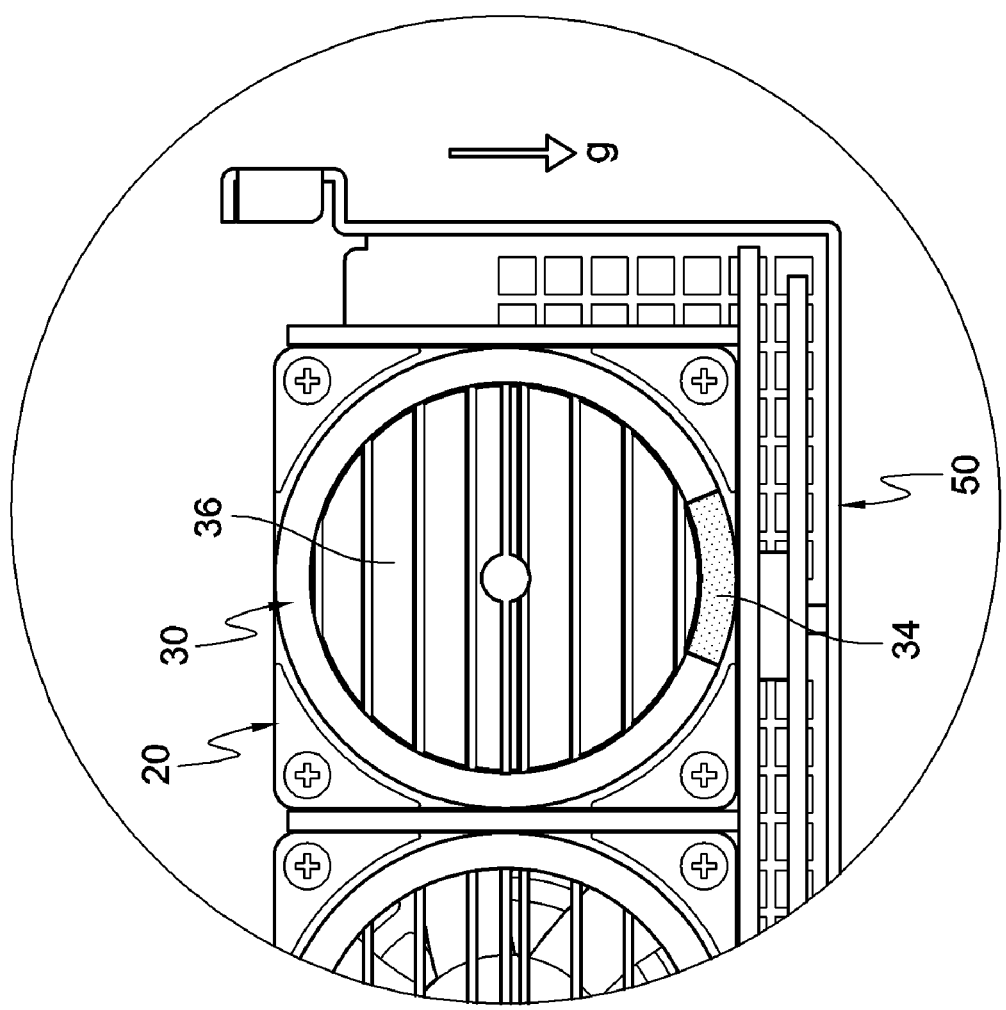
FIG. 8 is a schematic partial enlarged view of FIG. 7.

Referring to FIGS. 5, 6, 7, and 8, a plurality of fans 10 assembled with the wind guiding cover of the present invention is densely arranged on a mobile rack 50. The mobile rack 50 can be mounted on a main cabinet of a server (not shown). When mounted on the server in an upright manner (as shown in FIG. 5), the mobile rack 50 is disposed parallel to the gravity direction (represented by an arrow plus "g" in the figure). When transversely laid on the server (as shown in FIG. 7), the mobile rack 50 is disposed perpendicular to the gravity direction (represented by an arrow plus "g" in the figure). In both cases, the weight portion 34 maintains the slats 36 of the rotating ring 30 at a horizontal position. Therefore, once any one of the fans 10 stops operating due to failure or other factors, the slats 36 spontaneously drop due to the gravity and completely cover the opening 31 of the rotating ring 30, thus preventing air flows generated by other fans 10 from flowing back at the position of the failed fan 10.

Figure 9:
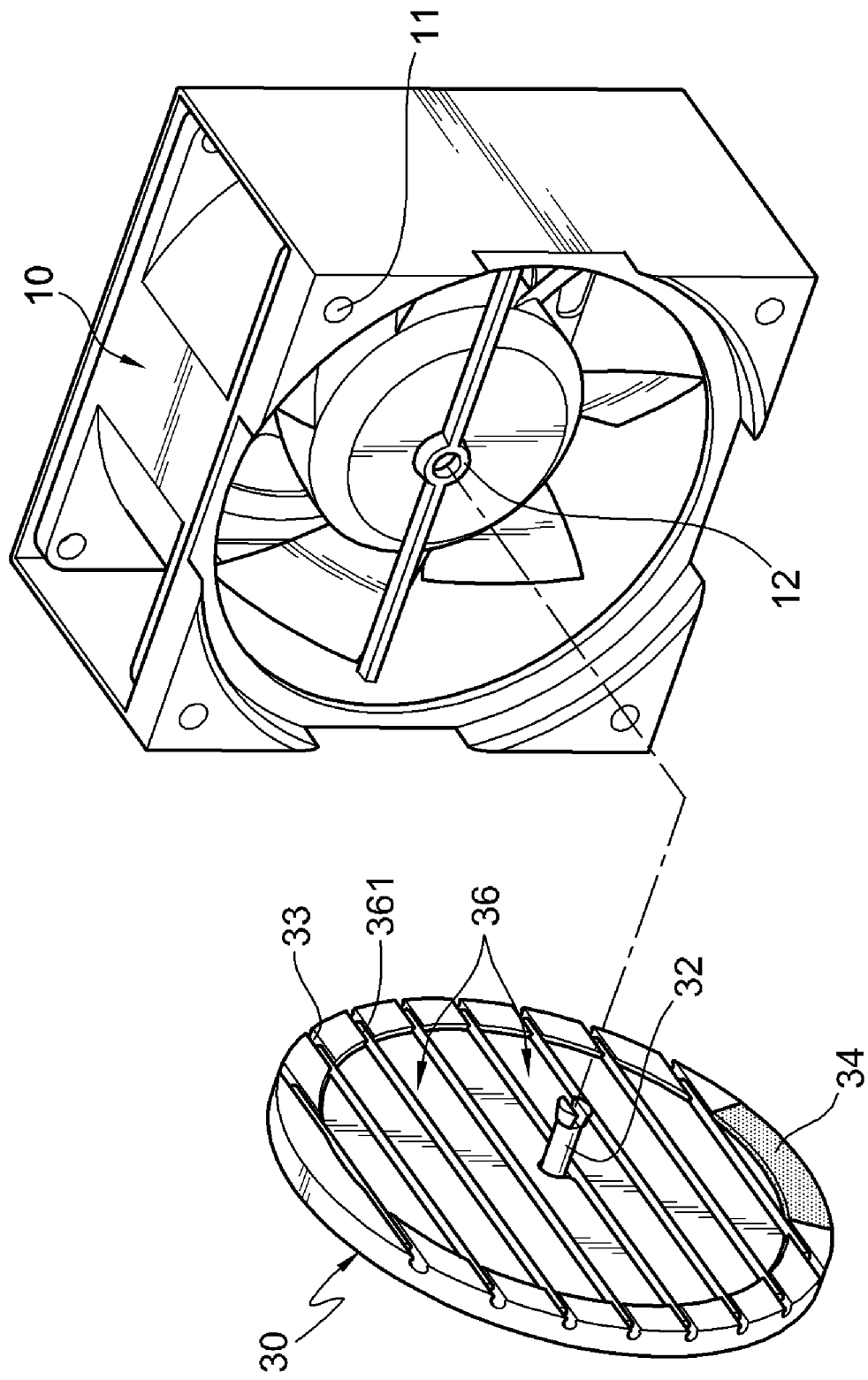
FIG. 9 is an exploded view of a wind guiding cover and a fan according to a second embodiment of the present invention.

FIG. 9 is a schematic view of a wind guiding cover according to a second embodiment of the present invention. The main structure of this embodiment is similar to that of the first embodiment, and only the differences between the two embodiments will be illustrated hereinafter. The wind guiding cover of the second embodiment is mounted on a fan 10, and the fan 10 has a bearing 12. The wind guiding cover of this embodiment includes a rotating ring 30 and a plurality of slats 36. The rotating ring 30 has a camshaft 32. The camshaft 32 is inserted into the bearing 12 of the fan 10. The rotating ring 30 rotates relative to the fan 10 with the camshaft 32 as a rotating shaft. In addition, the illustration of the remaining structure of the wind guiding cover can be seen from the description of the first embodiment, and the details will not be given herein again. Therefore, in this embodiment, the weight portion 34 may also maintain the slats 36 at a horizontal position, so as to enable the slats 36 to completely cover the opening 31 of the rotating ring 30 when the fan 10 stops operating.

FIG. 10 is a schematic view of a wind guiding cover according to a third embodiment of the present invention. The main structure of this embodiment is similar to that of the first embodiment, and only the differences between the two embodiments will be illustrated hereinafter. The wind guiding cover of the third embodiment is mounted on a fan 10. The fan 10 has an actuating groove 13. The rotating ring 30 is placed in the actuating groove 13. The inner diameter of the actuating groove 13 matches the outer diameter of the rotating ring 30, and the rotating ring 30 may rotate within the actuating groove 13 relative to the fan 10. It should be understood that, in practical applications, an outer cover may be added to prevent the rotating ring 30 from dropping out, and a lubricating fluid such as grease may also be coated on the inner side of the actuating groove 13 to enable the rotating ring 30 to rotate smoothly. In addition, the illustration of the remaining structure of the wind guiding cover can be seen from the description of the first embodiment, and the details will not be given herein again. Therefore, in this embodiment, the weight portion 34 may also maintain the slats 36 at a horizontal position, so as to enable the slats 36 to completely cover the opening 31 of the rotating ring 30 when the fan 10 stops operating.

The rotating ring of the present invention is provided with the weight portion so as to enable the slats to be normally maintained at a horizontal position. In that case, when the fan operates, the slats are lifted to allow the air flow to pass through the opening of the rotating ring. When the fan stops operating, the slats drop due to the gravity and cover the opening of the rotating ring, so that the air flow can be effectively prevented from flowing back when the fan fails, and thus the thermal-dissipation efficiency will not be affected

What is claimed is:

1. A wind guiding cover, mounted on a fan adapted to operate to generate an air flow, comprising:
    a rotating ring, rotatably disposed on the fan, and having an opening for the air flow to pass through, wherein the rotating ring has a weight portion for offsetting the center of gravity of the rotating ring and normally maintaining the rotating ring at a static equilibrium position; and
    a plurality of slats, pivoted to the rotating ring and arranged at the opening, wherein when the fan operates, the slats are lifted by the air flow so as to open the opening, and when the fan stops operating, the slats cover the opening due to the gravity.

2. The wind guiding cover according to claim 1, further comprising a fixed cover fixed to the fan, wherein the rotating ring is pivoted to the fixed cover and assembled to the fan via the fixed cover.

3. The wind guiding cover according to claim 2, wherein the rotating ring has a camshaft, the fixed cover has a bearing, and the camshaft is inserted into the bearing to make the rotating ring pivoted to the fixed cover.

4. The wind guiding cover according to claim 2, further comprising a plurality of bolts, wherein the fan is provided with a plurality of bolt holes, the fixed cover is provided with a plurality of through-holes corresponding to the bolt holes respectively, and the bolts are screwed into the corresponding bolt holes via the through-holes, so as to lock the fixed cover to the fan.

5. The wind guiding cover according to claim 1, wherein the fan has a bearing, the rotating ring has a camshaft, the camshaft is inserted into the bearing, and the rotating ring rotates about the camshaft relative to the fan.

6. The wind guiding cover according to claim 1, wherein the fan has an actuating groove, the rotating ring is placed in the actuating groove, and the size of the actuating groove is larger than that of the rotating ring, so as to enable the rotating ring to rotate within the actuating groove relative to the fan.

7. The wind guiding cover according to claim 1, wherein an outer edge of the rotating ring has a plurality of pairs of pivot holes, each slat has a shaft, and two ends of the shaft are respectively inserted into each pair of the pivot holes, such that the slat swings about the shaft relative to the rotating ring.

\* \* \* \* \*